(12) United States Patent
Lai et al.

(10) Patent No.: US 11,876,037 B1
(45) Date of Patent: Jan. 16, 2024

(54) CHIP STACKING AND PACKAGING STRUCTURE

(71) Applicant: HOSIN GLOBAL ELECTRONICS CO., LTD, Shenzhen (CN)

(72) Inventors: Chen-Nan Lai, Shenzhen (CN); Qingshui Liu, Shenzhen (CN)

(73) Assignee: HOSIN GLOBAL ELECTRONICS CO., LTD, Shenzhen (CN)

( * ) Notice: Subject to any disclaimer, the term of this patent is extended or adjusted under 35 U.S.C. 154(b) by 0 days.

(21) Appl. No.: 18/340,881

(22) Filed: Jun. 25, 2023

(30) Foreign Application Priority Data

Jun. 27, 2022 (CN) .......................... 202210746507.6

(51) Int. Cl.
| | | |
|---|---|---|
| *H01L 23/00* | (2006.01) | |
| *H01L 23/473* | (2006.01) | |
| *H01L 25/065* | (2023.01) | |
| *H01L 23/498* | (2006.01) | |
| *H01L 23/48* | (2006.01) | |

(52) U.S. Cl.
CPC .......... *H01L 23/473* (2013.01); *H01L 23/481* (2013.01); *H01L 23/49816* (2013.01); *H01L 24/08* (2013.01); *H01L 25/0657* (2013.01); *H01L 2224/0823* (2013.01); *H01L 2225/06589* (2013.01); *H01L 2924/3025* (2013.01)

(58) Field of Classification Search
CPC ..... H01L 23/473; H01L 23/481; H01L 24/08; H01L 25/0657
See application file for complete search history.

(56) References Cited

U.S. PATENT DOCUMENTS

| | | | |
|---|---|---|---|
| 11,031,394 B1* | 6/2021 | Or-Bach ................. | G06F 30/39 |
| 11,705,437 B1* | 7/2023 | Deng ................... | H01L 25/0657 |
| | | | 257/774 |
| 2015/0179617 A1 | 6/2015 | Lin et al. | |
| 2017/0103937 A1 | 4/2017 | Hsieh et al. | |
| 2021/0249328 A1 | 8/2021 | Refai-Ahmed | |
| 2023/0041344 A1* | 2/2023 | Or-Bach ................. | H01L 24/33 |
| 2023/0187397 A1* | 6/2023 | Or-Bach ................. | H01L 25/18 |
| | | | 257/690 |
| 2023/0329011 A1* | 10/2023 | Or-Bach ................. | H10B 80/00 |
| | | | 257/621 |

FOREIGN PATENT DOCUMENTS

| | | |
|---|---|---|
| CN | 111081655 A | 4/2020 |
| CN | 111128917 A | 5/2020 |
| CN | 113284867 A | 8/2021 |

* cited by examiner

*Primary Examiner* — Thao P Le

(57) ABSTRACT

A chip stacking and packaging structure includes a substrate, a first chip stacked on the substrate, a heat dissipation module, and a second chip stacked on the heat dissipation module. First bonding pads and second bonding pads are arranged on the substrate. First welding pins are arranged on the first chip. The first welding pins one-to-one cover and are one-to-one electrically connected to the first bonding pads. The heat dissipation module includes a first groove, a cooling liquid cavity, a liquid inlet, a liquid outlet, and first conductive columns. The first chip is embedded in the first groove. A side wall and a bottom wall of the first groove extend into the cooling liquid cavity. Each of the first conductive columns is electrically connected with a corresponding second bonding pad. Each of second welding pins of the second chip is electrically connected to a corresponding first conductive column.

9 Claims, 4 Drawing Sheets

CHIP STACKING AND PACKAGING STRUCTURE

TECHNICAL FIELD

The present disclosure relates to a field of chip packaging, and in particular to a chip stacking and packaging structure.

BACKGROUND

With improvement and development of technology, integrated circuits continuously decrease in size and continuously improve in function. With improvement in the function of the integrated circuits, the number of transistors required for the integrated circuits increases, and the number of semiconductors (i.e. bare dies) packaged in a single chip increases. With an improvement of integration, an increase of power consumption, and a decrease of size, heat generated by the integrated circuits increases rapidly. In general, a failure ratio of electronic components increases exponentially with an increase of temperature. Generally, at a range of 70-80° C., a reliability of the electronic components decreases by 5% when a temperature of the electronic components increases by 1° C. Therefore, a heat dissipation problem of the electronic components becomes a major challenge in development and application of advanced electronic chip systems.

A micro-channel heat dissipation structure is a plate layer defining a micro channel with openings at two ends. In conventional heat dissipation methods, a micro-channel heat dissipation method is a heat dissipation technology with high efficiency. The micro-channel heat dissipation structure is attached to a surface of a chip. Cooling liquid flows in from an opening on a first end of the micro channel, and the cooling liquid absorbs heat generated by a device where the micro-channel heat dissipation structure is arranged and flows out from an opening on a second end of the micro channel, thereby achieving a purpose of heat dissipation of the device. The micro-channel heat dissipation method has advantages of high surface area/volume ratio, low thermal resistance, low flow, etc., and is therefore an effective heat dissipation method.

However, at present, a preparation process of the micro-channel heat dissipation structure applied to an interior of the chip is complex, and first through holes need to be prepared by a Through-Silicon Vias (TSV) process to form a micro channel spread between the bare dies. Further, the micro channel must be etched on a substrate under a condition that the substrate comprises a rewiring layer, so that process cost is increased, the preparation process is extremely tedious and complex, and miniaturization and industrial development of a packaging structure are not facilitated.

SUMMARY

A technical problem to be solved by the present disclosure is to provide a chip stacking packaging structure, so as to solve problems that the above-mentioned conventional heat dissipation methods cannot meet heat dissipation requirements of a three-dimensionally packaged electronic chip with a high degree of integration, and a micro-channel heat dissipation structure has a complicated preparation process and high cost.

In order to solve the above problems, the present disclosure provides the chip stacking and packaging structure. The chip stacking and packaging structure comprises a substrate, a first chip, a heat dissipation module, and a second chip. First bonding pads and second bonding pads are arranged on a first surface of the substrate.

The first chip is stacked on the first surface of the substrate. First welding pins are arranged on a first surface of the first chip. The first welding pins one-to-one cover the first bonding pads and are one-to-one electrically connected to the first bonding pads.

The heat dissipation module is staked on the first surface of the substrate. The heat dissipation module comprises a first groove, a cooling liquid cavity, a liquid inlet, a liquid outlet, and first conductive columns. The liquid inlet and the liquid outlet are respectively communicated with the cooling liquid cavity. The cooling liquid cavity is connected to an external cooling liquid circulation system through the liquid inlet and the liquid outlet. Each of the first conductive columns is spaced apart from the first groove. Each of the first conductive columns passes through the cooling liquid cavity. Each of the first conductive columns penetrates a first surface and a second surface of the heat dissipation module. A bottom end of each of the first conductive columns is electrically connected with a corresponding second bonding pad of the second bonding pads arranged on the first surface of the substrate. An opening of the first groove is located on the second surface of the heat dissipation module. The first chip is embedded in the first groove from the opening. A side wall and a bottom wall of the first groove extend into the cooling liquid cavity.

The second chip is stacked on the first surface of the heat dissipation module. Second welding pins are arranged on a first surface of the second chip. Each of the second welding pins of the second chip is electrically connected to a top end of a corresponding first conductive column of the first conductive columns.

In one optional embodiment, the heat dissipation module comprises a heat dissipation pad and a heat dissipation plate. The heat dissipation pad is concentric-square-shaped. The heat dissipation plate is flat-plate-shaped. A height of the heat dissipation pad is matched with a height of the first chip. The cooling liquid cavity is defined in the heat dissipation plate.

The heat dissipation pad is fixed on the first surface of the substrate and surrounds the first chip. An inner side wall of the heat dissipation pad forms the side wall of the first groove. The heat dissipation plate is fixed above the heat dissipation pad and the first chip. A surface of the heat dissipation plate forms the bottom wall of the first groove. Each of the first conductive columns passes through the heat dissipation pad and the heat dissipation plate.

In one optional embodiment, the heat dissipation module comprises first sleeves, each of the first sleeves is spaced apart from the first groove. Each of the first conductive columns is sleeved in a corresponding first sleeve of the first sleeves.

In one optional embodiment, sheet-shaped heat conducting plates respectively connected to the bottom wall of the first groove are arranged in the cooling liquid cavity. The sheet-shaped heat conducting plates are respectively perpendicular to the bottom wall of the first groove and distributed along a flow direction of cooling liquid in the cooling liquid cavity.

In one optional embodiment, heat conducting columns respectively connected to the bottom wall of the first groove are arranged in the cooling liquid cavity. The heat conducting columns are respectively perpendicular to the bottom wall of the first groove.

In one optional embodiment, the heat dissipation module comprises a main body portion and a cover plate. The main body portion comprises a bottom plate and four side plates. The first groove is located on the bottom plate. A first end of each of the four side plates is perpendicularly connected to a corresponding edge of four edges of the bottom plate. A second end of each of the four side plates is fixed to the cover plate. The bottom plate, the four side plates, and the cover plate enclose to define the cooling liquid cavity. A first end of each of the first sleeves is perpendicularly connected to the bottom plate. A second end of each of the first sleeves extends to the cover plate.

In one optional embodiment, flow guide partition plates are arranged in the cooling liquid cavity. The flow guide partition plates are respectively perpendicular to the first surface or the second surface of the heat dissipation module. The flow guide partition plates are distributed along a flow direction of cooling liquid in the cooling liquid cavity. The first conductive columns are respectively arranged in the flow guide partition plates.

In one optional embodiment, third bonding pads are arranged on the first surface of the substrate.

The heat dissipation module comprises second conductive columns and a second groove. An opening of the second groove is on the first surface of the heat dissipation module. An area of a cross section of the second groove is greater than an area of a cross section of the first groove. At least a portion of the second groove is arranged outside an orthographic projection of the first groove. Each of the second conductive columns passes through the cooling liquid cavity from a bottom wall of the second groove and is connected to the second surface of the heat dissipation module. The second conductive columns are spaced apart from the first groove. A bottom end of each of the second conductive columns is electrically connected with a corresponding third bonding pad of the third bonding pads arranged on the substrate.

The chip stacking and packaging structure further comprises a temperature sensing chip. The third welding pins are arranged on a surface of the temperature sensing chip. The temperature sensing chip is embedded in the second groove and is electrically connected to a top end of each of the second conductive columns through a corresponding third welding pins of the third welding pins.

In one optional embodiment, a second surface of the first chip defines an electromagnetic shielding layer.

In one optional embodiment, the chip stacking and packaging structure further comprises a packaging body. The substrate, the first chip, the second chip, and the heat dissipation module are integrally packaged to form a chip main body through the packaging body. The liquid inlet and the liquid outlet respectively extend out of the packaging body. Connecting heads are respectively arranged on a portion, extending out of the packaging body, of the liquid inlet and a portion, extending out of the packaging body, of the liquid outlet.

In the chip stacking packaging structure of the present disclosure, the first groove is embedded in the cooling liquid cavity of the heat dissipation module, and the first chip is cooled through the cooling liquid flowing through the cooling liquid cavity and the first groove, which ensure heat dissipation efficiency of the first chip while simplifying a process of the chip stacking packaging structure and reducing costs.

DETAILED DESCRIPTION

In order to make objectives, technical solutions, and advantages of the present disclosure clearer, the following further describes the present disclosure in detail with reference to accompanying drawings and embodiments. It should be understood that the specific embodiments described here are only used to explain the present disclosure, but not to limit the present disclosure.

Figure 1:
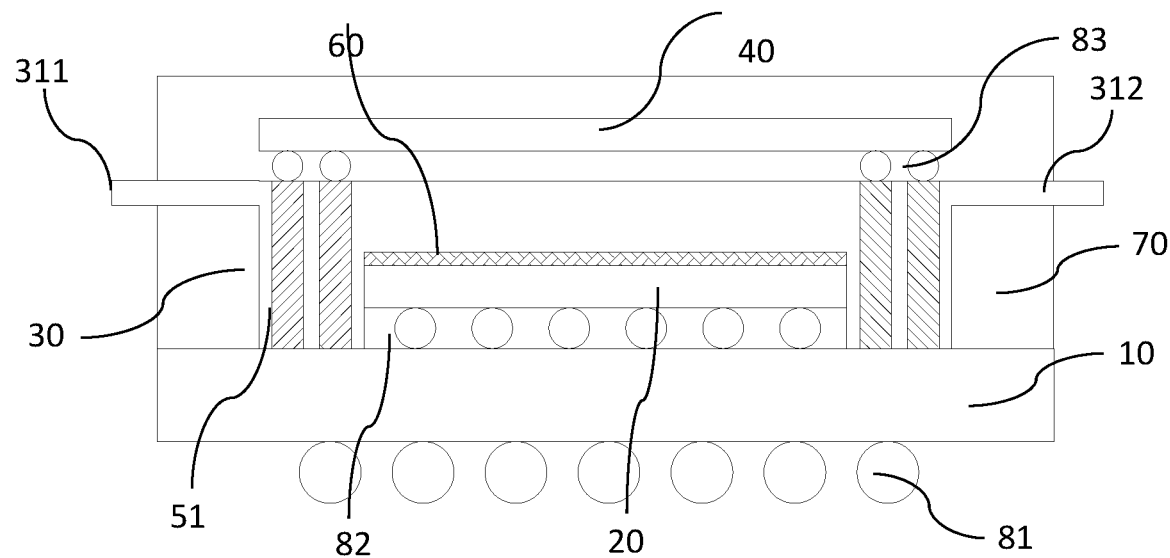
FIG. 1 is a schematic diagram of a chip stacking packaging structure according to one embodiment of the present disclosure.

As shown in FIG. 1, FIG. 1 is a schematic diagram of a chip stacking packaging structure according to one embodiment of the present disclosure. The chip stacking packaging structure is configured to stack and package of chips.

In the embodiment, the chip stacking and packaging structure comprises a substrate 10, a first chip 20, a heat dissipation module 30, and a second chip 40. The substrate 10, the first chip 20, the second chip 40, and the heat dissipation module 30 are integrally packaged to form a chip main body through a packaging body 70 (e.g. packaging glue), so as to protect components in an interior of the chip main body and improve serve life of the chip main body. Both of the first chip 20 and the second chip 40 are unpackaged dies, and a size of the first chip 20 is less than a size of the second chip 40. The first chip 20 and the second chip 40 may be dies of different types or same type. Passive elements, such as resistors, capacitors, etc., may also be packaged in the package body 70. The passive elements may together form a circuit with the first chip 20 and the second chip 40 to implement corresponding functions. Of course, in practical applications, the first chip 20 may be separately packaged first then the first chip 20 is packaged with the chip stacking packaging structure. That is, the first chip 20 is a packaged product. Specifically, when the chip stacking and packaging structure of the embodiment is configured to store a packaged chip, the first chip 20 is a main control chip, and the second chip 40 is a storage medium (e.g. flash crystal grains, etc.).

In the embodiment, the substrate 10 is an adapter substrate configured to carry the first chip 20 and the passive elements, and mainly comprises a substrate body (specifically, a hard substrate body, a flexible thin film substrate body, a co-fired ceramic substrate body, etc.) and a conductive circuit (e.g., a copper foil having a thickness of 1.5-18 μm) arranged on a surface of the substrate body or arranged inside the substrate body. First bonding pads and second bonding pads are arranged on a first surface (e.g., an upper surface) of the substrate 10. The first pads and the second pads are electrically connected to the conductive circuit.

The substrate 10 not only realizes fixing and thermal conduction of the first chip 20 and the passive elements, but also realizes electrical connection between the first chip 20, the second chip 40, and the passive elements. First welding pins are arranged on a first surface of the first chip 20. When the first chip 20 is stacked on the first surface of the substrate 10. The first welding pins one-to-one cover the first bonding pads and are one-to-one electrically connected to the first bonding pads. For example, the first welding pins and the first bonding pads are one-to-one welded together through a respective second solder ball 82, a metal contact sheet, or other conductive materials. Alternatively, the first welding pins and the first bonding pads are one-to-one bonded together through a conductive adhesive.

In addition, first solder balls 81 are arranged on a second surface of the substrate 10 (e.g., a lower surface of the substrate shown in FIG. 1). The first solder balls 81 are electrically connected to the conductive circuit and are extended from a bottom surface of the package body 70 (in the practical applications, the first solder balls 81 may be replaced by other conductive terminals, such as metal contact sheets, pins, etc.). The chip main body is soldered to a circuit board through the first solder balls 81 or the chip main body is electrically connected to elastic sheets of a connector through the first solder balls 81 after being assembled to the connector, so as to power the first chip 20 and the second chip 40 and realize signal interaction between the first chip 20 and other devices. Structures of the substrate 10, the first chip 20, the second chip 40, and the passive elements are conventional structures in the prior art, and details are not described herein.

The heat dissipation module 30 is made of a high-temperature-resistant heat-conducting insulating material, such as glass, ceramic, heat-conducting pouring sealant, heat-conducting insulating rubber, etc. A melting point of the high-temperature-resistant heat-conducting insulating material is much greater than a melting point of tin, so that an internal structure of the heat dissipation module 30 is not affected during a soldering process of the first chip 20 and the second chip 40 or when the first chip 20 and the second chip 40 are operated at a high frequency. Specifically, a main body of the heat dissipation module 30 is in a cuboid shape, and a size of a cross section of the main body of the heat dissipation module 30 is no more than a size of the first surface of the substrate 10 and greater than a size of a second surface of the first chip 20.

Specifically, the heat dissipation module 30 comprises a first groove, a cooling liquid cavity 313, a liquid inlet 311, a liquid outlet 312, and first conductive columns 51. The liquid inlet 311 and the liquid outlet 312 are respectively communicated with the cooling liquid cavity. The cooling liquid cavity 313 is connected to an external cooling liquid circulation system through the liquid inlet 311 and the liquid outlet 312. Cooling liquid flows into the cooling liquid cavity 313 through the liquid inlet 311, and then flows out from the liquid outlet 312. Each of the first conductive columns 51 is spaced apart from the first groove. Each of the first conductive columns 51 passes through the cooling liquid cavity 313. Each of the first conductive columns 51 penetrates a first surface and a second surface of the heat dissipation module 30. That is, the first conductive columns are arranged in the cooling liquid cavity 313. An opening of the first groove is located on the second surface of the heat dissipation module 30 (a lower surface of the heat dissipation module 30 as shown in FIG. 1). A side wall and a bottom wall of the first groove extend into the cooling liquid cavity 313. In particular, the first groove is defined on a central area of the second surface of the heat dissipation module 30. The first conductive columns 51 are arranged around the first groove. The first conductive columns 51 are perpendicular to the first surface and the second surface of the heat dissipation module 30, and the first conductive columns 51 are solid columns or hollow columns.

The heat dissipation module 30 is stacked on the substrate 10 and the second surface (e.g., the lower surface of the heat dissipation module 30 shown in FIG. 1) of the heat dissipation module 30 faces the first surface of the substrate 10, the first chip 20 is embedded in the first groove from the opening of the first groove. A bottom end of each of the first conductive columns 51 is electrically connected with a corresponding second bonding pad of the second bonding pads arranged on the first surface of the substrate 10. Specifically, the heat dissipation module 30 and the substrate 10 are fixed by coupling, gluing, etc. The bottom end of each of the first conductive columns 51 is welded to the corresponding second bonding pad through a third solder ball, or the bottom end of each of the first conductive columns 51 is bonded to the corresponding second bonding pad through the conductive adhesive. In the practical applications, the gap between the first chip 20 and the first groove is filled with a thermally conductive adhesive or the like, so as to improve heat conduction efficiency between the first chip 20 and the heat dissipation module 30.

The second chip 40 is stacked on the first surface of the heat dissipation module 30. Second welding pins are arranged on a first surface of the second chip 40. Each of the second welding pins of the second chip 40 is (directly or through a switching substrate) electrically connected to a top end of a corresponding first conductive column of the first conductive columns 51. Specifically, each of the second welding pins is welded to the top end of the corresponding first conductive column 51 through a third solder ball 83, or each of the second welding pins is bonded to the top end of the corresponding first conductive column 51 through the conductive adhesive. In the practical applications, there may be a plurality of second chips 40.

In this way, the cooling liquid flowing through the cooling liquid cavity 313 absorbs heat generated by the first chip 20 when the first chip 20 arranged in the first groove works, so that the first chip 20 is always at a proper working temperature. Since the first conductive columns 51 are partially arranged in the cooling liquid cavity 313, in addition to taking away the heat generated by the first chip 20, the cooling liquid further exchanges heat with the first conductive columns 51 through heat conduction. Thus, the first conductive columns 51 continuously absorb heat generated by the second chip 20 when the second chip 40 works, so that the second chip 40 realize efficient heat dissipation without being embedded into the heat dissipation module 30. Moreover, since the heat dissipation module 30 is a relatively independent structure, efficient heat dissipation of the chip stacking and packaging structure is realized while a processing process is simplified.

Optionally, in order to avoid frequency interference between the first chip 20 and the second chip 40 when the first chip 20 and the second chip 40 work at a high frequency at the same time, an electromagnetic shielding layer 60 is arranged on a second surface of the first chip 20 (e.g., an upper surface of the first chip 20 shown in FIG. 1) or the bottom wall of the first groove of the heat dissipation module 30 (i.e., an area of the first groove matched with the second surface of the first chip 20). The electromagnetic shielding layer 60 is formed on the second surface of the first chip 20 or the bottom wall of the first groove by spraying, attaching, or depositing.

Figure 2:
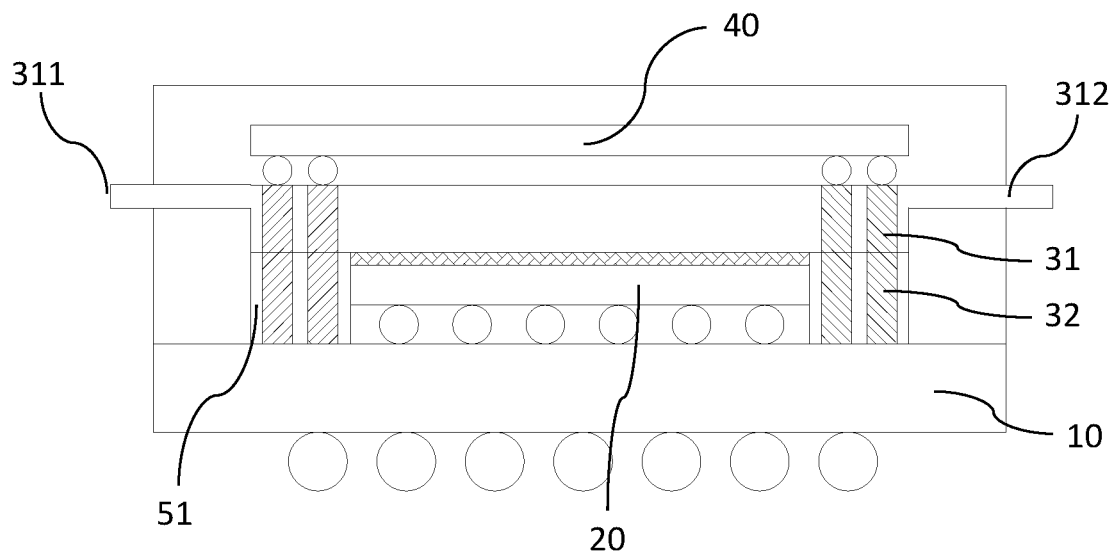
FIG. 2 is a schematic diagram of the chip stacking packaging structure according to another embodiment of the present disclosure.

As shown in FIG. 2, in another embodiment of the present disclosure, the heat dissipation module 30 comprises a heat dissipation pad 32 and a heat dissipation plate 31. The heat dissipation pad 32 is concentric-square-shaped. The heat dissipation plate 31 is flat-plate-shaped. A height of the heat dissipation pad 32 is matched with a height of the first chip 20. The liquid inlet 311, the liquid outlet 312, and the cooling liquid cavity 313 are defined in the heat dissipation plate 31. The heat dissipation pad 32 is fixed on the first surface of the substrate 10 and surrounds the first chip 20. An inner side wall of the heat dissipation pad 32 forms the side wall of the first groove. The heat dissipation plate 31 is fixed above the heat dissipation pad 32 and the first chip 20. A surface of the heat dissipation plate 31 (i.e., a lower surface of the heat dissipation plate 31) forms the bottom wall of the first groove. Each of the first conductive columns 51 passes through the heat dissipation pad 32 and the heat dissipation plate 31. That is, each of the first conductive columns 51 comprises a first portion arranged within the heat dissipation pad 32 and a first portion arranged within the heat dissipation plate 31.

On one hand, the above structures reduce a manufacturing difficulty of the first groove of the heat dissipation module 30 in the process, and on the other hand, the chip stacking and packaging structure is replaceable to have various sizes or types. That is, the heat dissipation pad 32 is replaceable to have different sizes according to a size of the first chip 20. The heat dissipation plate 31 arranged above the heat dissipation pad 32 is replaced to be matched with the heat dissipation pad 32. Specifically, first sleeves arranged on the heat dissipation plate 31 should be matched with first through holes on the heat dissipation pad 32. Moreover, with regard to the heat dissipation pad 32, the heat dissipation pad 32 is able to absorb heat to a certain extent. Therefore, the cooling liquid flowing through the cooling liquid cavity 313 defined in the heat dissipation plate 31 takes away heat transferred to the heat dissipation pad 32 through heat conduction.

Figure 3:
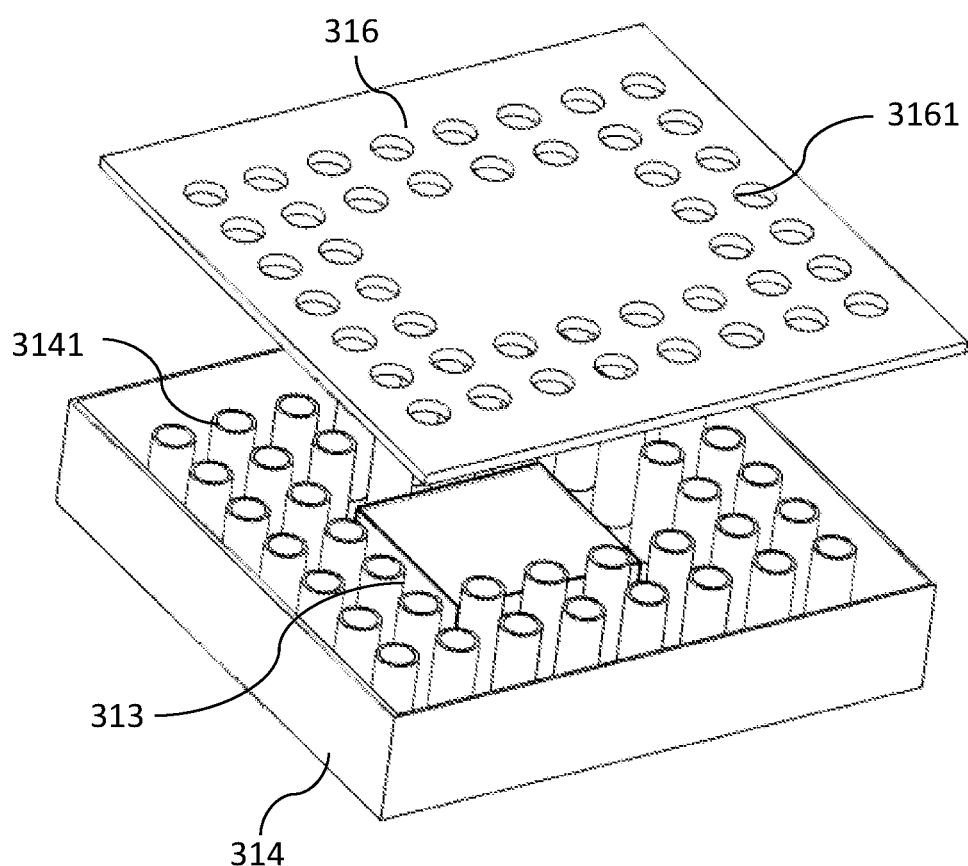
FIG. 3 is a schematic diagram of a heat dissipation module of the chip stacking packaging structure according to one embodiment of the present disclosure.

As shown in FIG. 3, in one embodiment of the present disclosure, the heat dissipation module 30 comprises a main body portion 314 and a cover plate 316. The main body portion 314 comprises a bottom plate and four side plates. The first groove is located on the bottom plate. A first end of each of the four side plates is perpendicularly connected to a corresponding edge of four edges of the bottom plate. That is, the main body portion of the heat dissipation module 30 is box-shaped. The cover plate is flat-plate-shaped. A second end of each of the four side plates is fixed to the cover plate. The bottom plate, the four side plates, and the cover plate 316 enclose to define the cooling liquid cavity 313. In the practical applications, in addition to being in the cuboid shape, the heat dissipation module 30 may be in other shapes, such as a cylindrical shape (at this situation, the main body portion 314 comprises the bottom plate and an annular side plate), a pentagonal prism shape (at this situation, the main body portion 314 comprises the bottom plate and five side plates), or etc.

A first end of each of the first sleeves 3141 is perpendicularly connected to the bottom plate. A second end of each of the first sleeves 3141 extends to the cover plate 316. Particularly, in order to reduce turbulent flow, a width of each of the first sleeves 3141 facing the liquid inlet 311 is greater than a width of each of the first sleeves 3141 facing the liquid outlet 312. That is, a cross section of each of the first sleeves 3141 is in a water drop shape instead of being circular.

Correspondingly, the cover plate 316 defines first through holes 3161. When the cover plate 316 covers the main body portion 314 (i.e., the second end of each of the four side plates of the main body portion 314 is fixed to the cover plate 316), the second end of each of the first sleeves 3141 is communicated with a corresponding first through hole 3161 of the first through holes. Specifically, the second end of each of the first sleeves 3141 is inserted into the corresponding first through hole 3161. That is, an outer wall of each of the first sleeves 3141 abuts against or is bonded with the corresponding first through hole 3161, so that the cooling liquid cavity 313 is relatively sealed. Alternatively, the second end of each of the first sleeves 3141 is stepped. That is, an outer diameter of the second end of each of the first sleeves 3141 is less than an outer diameter of other portion of each of the first sleeves 3141, so that the second end of each of the first sleeves 2141 is easily inserted into the corresponding first through hole 3161 on the cover plate 316.

Particularly, in order to ensure a sealing effect of the cover plate 316 and the main body portion 314, a step structure is arranged at a joint of the main body portion 314 and the cover plate 316. A height of an outer side of the step structure is higher than a height of an inner side of the step structure. The cover plate 316 is embedded in the step structure. Alternatively, a flange structure is arranged at the joint of the main body portion 314 and the cover plate 316.

In the actual applications, the first sleeves 3141 may be arranged on the cover plate 316, and the first through holes are defined on the bottom plate of the main body portion 314. In addition, if the cooling liquid is insulating cooling liquid, the heat dissipation module 30 does not comprise the first sleeves 3141, and the first conductive columns 51 directly pass through the cooling liquid cavity 313.

Specifically, the heat dissipation module 30 is prepared by following method. First, holes matching the second bonding pads of the substrate 10 are etched on a silicon, glass, ceramic plate or block (i.e., the main body portion 314) less than the substrate 10, where an etching method may specifically be a dry etching method, a wet etching method, or a laser etching method (all of which are the prior art, and details are not described herein). After etching of the holes is completed, the main body portion 314 comprises the holes.

Further, a middle portion of a second surface of the main body portion 314 (i.e., a lower surface of the main body portion 314 shown in FIG. 3) is etched to form the first groove. Then, a first surface of the main body portion 314 (i.e., an upper surface of the main body portion 314 shown in FIG. 3) is etched to form the cooling liquid cavity 313. Specifically, after the holes and the first grooves are etched to a predetermined thickness, other portion of the main body portion is etched by the laser etching method to form a liquid inlet hole, a liquid outlet hole, the side plates, the first sleeves 3141, and the bottom plate.

Further, there is a certain interval between each two adjacent first sleeves 3141, and the interval between each two adjacent first sleeves 3141 corresponds to an interval between each two adjacent second welding pins of the second chip 40 or an interval between each two adjacent bonding pads of the switching substrate (the switching substrate refers to the switching substrate arranged above the cooling liquid cavity for connecting the second chip). Then the cover plate 316 is prepared and the cover plate 316 is a thin substrate and is mainly configured for sealing and bonding. The cover plate 316 is etched to form the first through holes 3161. The first surface of the main body portion 314 away from the first groove is bonded to the cover plate 316. For example, when the main body portion 314 and the cover plate 316 are made of same materials, the main body portion 314 is directly bonded to the cover plate 316 by high-temperature bonding. When the main body portion 314 and the cover plate 316 are made of different materials, the main body portion 314 is bonded to the cover plate 316 by an adhesive. Then, two silicon wafers in a circular shape, in a rectangular shape, or on other shape convenient for the cooling liquid to pass through are provided. A middle portion of a long end of each of the silicon wafers is etched to form a through area, then the silicon wafers are respectively welded to the liquid inlet hole and the liquid outlet hole of the cooling liquid cavity to form the liquid inlet 311 and the liquid outlet 312.

Then, conductive metal is deposited on an inner wall of each of the first sleeves 3141 to form each of the first conductive columns 51. An outer wall of each of the first sleeves 3141 prevents the cooling liquid in the cooling liquid cavity 313 from contacting each of the first conductive columns 51, so as to prevent short circuit of the first conductive columns.

In the prior art, through holes are etched on a metal heat dissipation layer, and an insulating material needs to be prepared in the through holes, then the conductive metal is prepared, which increases process steps. Further, when the cooling liquid cavity 313 takes away the heat through the cooling liquid, a heat dissipation effect of the metal heat dissipation layer to a certain coefficient is weakened. Furthermore, a heat dissipation performance of the cooling liquid flowing as a whole is lower than a heat dissipation performance of the cooling liquid flowing into branches according to an article titled "Structural Design and Thermal Performance of Periodic Split Micro channels" of a reference periodical "physical education" in the prior art.

Compared with the prior art, in the embodiment, each of the first conductive columns 51 abuts against the inner wall of each of the first sleeves 3141 in the cooling liquid cavity 313 of the heat dissipation module 30, when the cooling liquid flows into the cooling liquid cavity, an outer wall of each of the first sleeves 3141 effectively splits the cooling liquid to form a turbulent flow effect, thereby improving the heat dissipation efficiency and system stability.

Of course, in the practical applications, the heat dissipation module 30 may be made of a high-temperature-resistant plastic material. Correspondingly, the main body portion 314 of the heat dissipation module 30 and the cover plate 316 (including the first sleeves 3141) are made by an injection molding method, thereby further simplifying the process and reducing costs.

In one embodiment of the present disclosure, in order to further improve the heat dissipation efficiency of the first chip 20, sheet-shaped heat conducting plates 3142 are arranged in the cooling liquid cavity 313. The sheet-shaped heat conducting plates 3142 are respectively connected to the bottom wall of the first groove. The sheet-shaped heat conducting plates 3142 are distributed along a flow direction of the cooling liquid in the cooling liquid cavity 313, such as along a direction from the liquid inlet 311 to the liquid outlet 312. Since the sheet-shaped heat conducting plates 3142 is directly connected to the bottom wall of the first groove, the sheet-shaped heat conducting plates absorb the heat of the bottom wall of the first groove by heat conduction, which is equivalent to increasing a contact area between the bottom wall of the first groove and the cooling liquid, so that the heat of the bottom wall of the first groove is quickly transferred, and then the heat of the bottom wall of the first groove is taken away by the cooling liquid.

Figure 5:
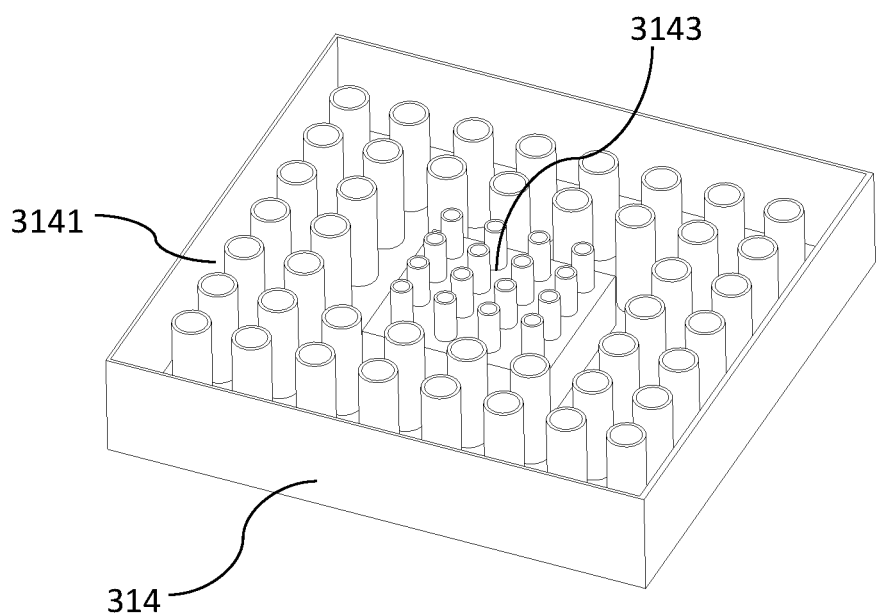
FIG. 5 is a schematic diagram of the main body portion of the heat dissipation module of the chip stacking packaging structure according to another embodiment of the present disclosure.

Similarly, as shown in FIG. 5, heat conducting columns 3143 are arranged in the cooling liquid cavity. The heat conducting columns 3143 are respectively connected to the bottom wall of the first groove. Since the heat conducting columns 3143 is directly connected to the bottom wall of the first groove, the heat conducting columns 3143 absorb the heat of the bottom wall of the first groove by heat conduction, which is equivalent to increasing a contact area between the bottom wall of the first groove and the cooling liquid.

The heat conducting columns 3143 are staggered. When the cooling liquid flows into an area above the bottom wall of the first groove, the cooling liquid flowing into the area above the bottom wall of the first groove is split by the heat conducting columns 3143, and the cooling liquid flows into branches, and the branches expand the contact area between the bottom wall of the first groove and the cooling liquid and improve the heat dissipation performance, so that the heat of the bottom wall of the first groove is quickly transferred, and then the heat of the bottom wall of the first groove is taken away by the cooling liquid.

Figure 6:
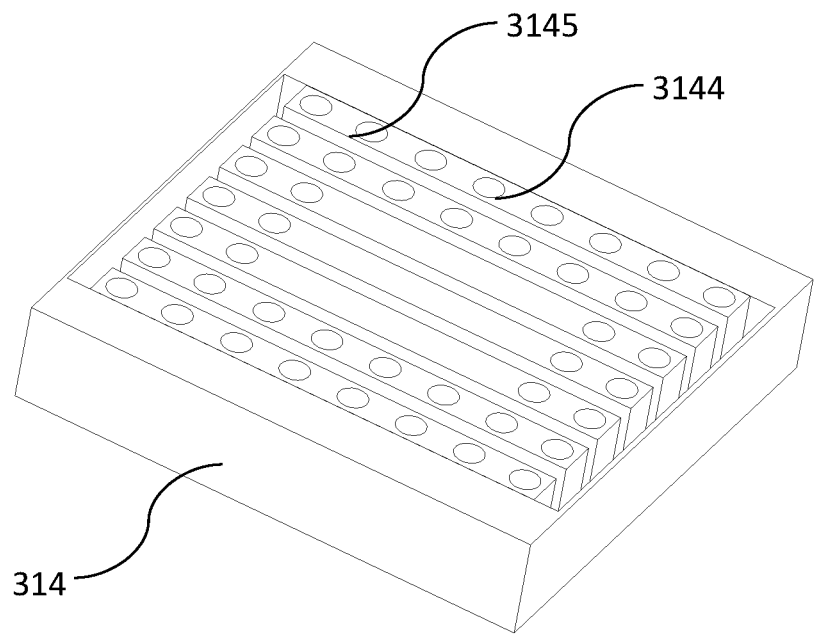
FIG. 6 is a schematic diagram of the main body portion of the heat dissipation module of the chip stacking packaging structure according to another embodiment of the present disclosure.

As shown in FIG. 6, in one optional embodiment, the heat dissipation module 30 comprises the main body portion 314 and the cover plate. The main body portion 314 comprises the bottom plate, four side plates, and flow guide partition plates 3144. The first groove is located on the bottom plate. The flow guide partition plates 3144 are distributed along the flow direction of the cooling liquid in the cooling liquid cavity.

Figure 4:
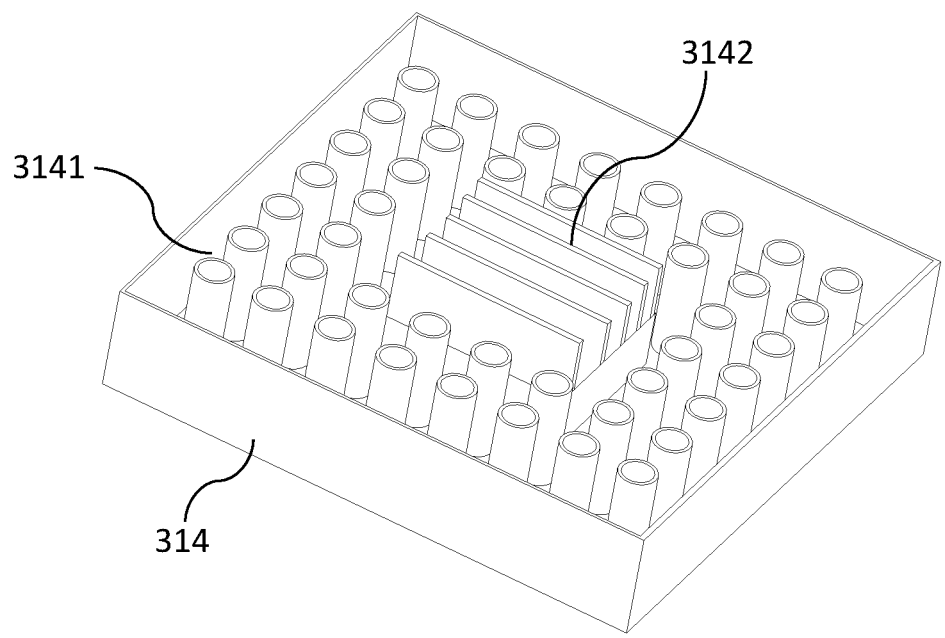
FIG. 4 is a schematic diagram of a main body portion of the heat dissipation module of the chip stacking packaging structure according to one embodiment of the present disclosure.

A bottom portion of each of the flow guide partition plates 3144 is connected to the bottom plate of the main body portion 314. In the embodiment, each of the flow guide partition plates 2144 comprises second through holes 3145. Correspondingly, the cover plate defines third through holes one-to-one corresponding to the second through holes 3145. The first conductive columns 51 are one-to-one arranged in the second through holes 3145 on the flow guide partition plates 3144 and the third through holes on the cover plate. For example, each of the first conductive columns 51 is a metal conductive layer deposited on an inner wall of a corresponding second through hole 3145 and an inner wall of a corresponding third through hole, or each of the first conductive columns 51 is a metal column arranged in the corresponding second through hole 3145 and the corresponding third through hole. Compared with a processing of the first sleeves 3141 shown in FIGS. 4-5, the flow guide partition plates 3144 reduce the turbulent flow of the cooling liquid in the cooling liquid cavity 313 while facilitating a processing of the first conductive columns 51.

Particularly, the flow guide partition plate 3144 may be integrated with the cover plate. Correspondingly, the bottom plate of the main body portion 314 defines the holes corresponding to the second through holes 3145 on the flow guide partition plates 3144.

Figure 7:
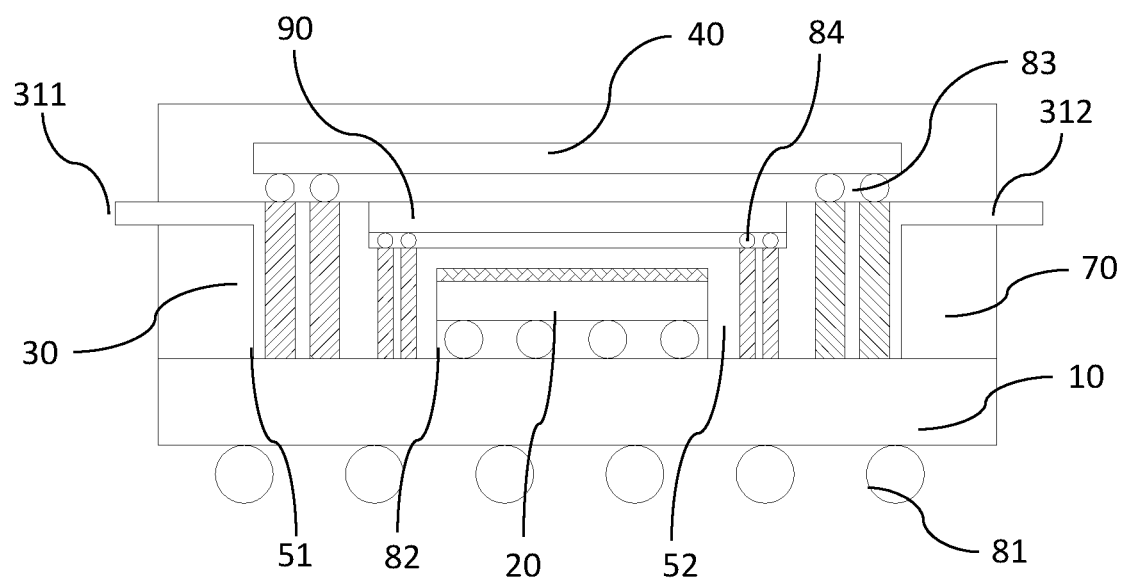
FIG. 7 is a schematic diagram of the chip stacking packaging structure according to another embodiment of the present disclosure.

As shown in FIG. 7, in one embodiment of the present disclosure, in addition to the substrate 10, the first chip 20, the heat dissipation module 30, and the second chip 40, the chip stacking and packaging structure further comprises a temperature sensing chip 90. The temperature sensing chip 90 outputs different signals according to a temperature of environment where the temperature sensing chip 90 is located. The temperature sensor chip 90 itself is a conventional technique in the prior art, and details are not described herein.

Correspondingly, in addition to the first bonding pads and the second bonding pads, third bonding pads are arranged on the first surface of the substrate 10. The heat dissipation module 30 further comprises second conductive columns 52 and a second groove. An opening of the second groove is on the first surface of the heat dissipation module 30. An area of a cross section of the second groove is greater than an area of a cross section of the first groove. At least a portion of the second groove is arranged outside an orthographic projection of the first groove. Each of the second conductive columns 52 passes through the cooling liquid cavity from a bottom wall of the second groove and is connected to the second surface of the heat dissipation module 30. The second conductive columns 52 are spaced apart from the first groove. A bottom end of each of the second conductive columns 52 is electrically connected with a corresponding third bonding pad of the third bonding pads arranged on the substrate 10.

In the practical applications, the area of the cross section of the second groove may be less than or equal to the area of the cross section of the first groove, so long as the second groove is staggered with the first groove, so that the second conductive columns 52 are spaced apart from the first groove and reach the second surface of the heat dissipation module 30 (i.e., a bottom portion of the heat dissipation module 30).

The third welding pins are arranged on a surface of the temperature sensing chip 90 (i.e., a lower surface of the temperature sensing chip). The temperature sensing chip 90 is embedded in the second groove and is (directly or through the switching substrate) electrically connected to a top end of each of the second conductive columns 52 through a corresponding third welding pins of the third welding pins and a fourth solder ball 84.

In the practical applications, a depth of the second groove is optionally not less than a height of the temperature sensing chip 90, thereby reducing an installation difficulty of the second chip 40. Accordingly, the heat dissipation module 30 further comprises second sleeves. The second conductive columns 52 are respectively formed in the second sleeves. Since heat generated by the temperature sensing chip 90 is not much, and the temperature sensing chip 90 is embedded in the second groove, an area of a cross section of each of the second conductive columns 52 configured to connect the corresponding third welding pin of the sensor chip 90 is less than the area of the cross section of each of the first conductive columns 51.

The temperature sensing chip 90 outputs a corresponding electrical signal through the second conductive columns 52 and the substrate 10 according to a temperature of the heat dissipation module 30. The corresponding electrical signal is transmitted to a control device of the external cooling liquid circulation system.

The control device adjusts a flow rate of the cooling liquid in the cooling external cooling liquid circulation system according to the temperature of the heat dissipation module 30, i.e., the control device adjusts the flow rate of the cooling liquid flowing through the cooling liquid cavity 313. For example, when the temperature of the heat dissipation module 30 is greater than a predetermined value, the control device adjusts the flow rate of the cooling liquid in the external cooling liquid circulation system quickly, thereby improving heat exchange efficiency of the heat dissipation module 30 and the first chip 20. When the temperature of the heat dissipation module 30 is less than the predetermined value, the control device decreases the flow rate of the cooling liquid in the external cooling liquid circulation system, thereby reducing the heat exchange efficiency of the heat dissipation module 30 and the first chip 20. In this way, energy consumption is reduced while ensuring a temperature of the chip main body.

Particularly, the chip stacking and packaging structure further comprises a packaging body 70. The substrate 10, the first chip 20, the second chip 40, and the heat dissipation module 30 are integrally packaged to form the chip main body through the packaging body 70. The liquid inlet 311 and the liquid outlet 312 respectively extend out of the packaging body 70. Connecting heads are respectively arranged on a portion, extending out of the packaging body 70, of the liquid inlet 311 and a portion, extending out of the packaging body 70, of the liquid outlet 312. The liquid inlet 311 and the liquid outlet 312 are communicated with the external cooling liquid circulation system through the connecting heads.

The foregoing is merely optional embodiments of the present disclosure, but the protection scope of the present disclosure is not limited thereto. Those skilled in the art may easily conceive of changes or substitutions within the technical scope disclosed by the present disclosure, and the changes or substitutions should be covered within the protection scope of the present disclosure. Therefore, the protection scope of the present disclosure shall be subject to the protection scope of the claims.

What is claimed is:

1. A chip stacking and packaging structure, comprising:
a substrate,
a first chip,
a heat dissipation module, and
a second chip;
wherein first bonding pads and second bonding pads are arranged on a first surface of the substrate;
wherein the first chip is stacked on the first surface of the substrate; first welding pins are arranged on a first surface of the first chip; the first welding pins one-to-one cover the first bonding pads and are one-to-one electrically connected to the first bonding pads;
wherein the heat dissipation module is stacked on the first surface of the substrate, the heat dissipation module comprises a first groove, a cooling liquid cavity, a liquid inlet, a liquid outlet, and first conductive columns; the liquid inlet and the liquid outlet are respectively communicated with the cooling liquid cavity; the cooling liquid cavity is connected to an external cooling liquid circulation system through the liquid inlet and the liquid outlet; each of the first conductive columns is spaced apart from the first groove; each of the first conductive columns passes through the cooling liquid cavity; each of the first conductive columns penetrates a first surface and a second surface of the heat dissipation module; a bottom end of each of the first conductive columns is electrically connected with a corresponding second bonding pad of the second bonding pads arranged on the first surface of the substrate; an opening of the first groove is located on the second surface of the heat dissipation module; the first chip is embedded in the first groove from the opening; and a side wall and a bottom wall of the first groove extend into the cooling liquid cavity;
wherein the second chip is stacked on the first surface of the heat dissipation module; second welding pins are arranged on a first surface of the second chip; each of the second welding pins of the second chip is electrically connected to a top end of a corresponding first conductive column of the first conductive columns;

wherein the heat dissipation module comprises a heat dissipation pad and a heat dissipation plate; the heat dissipation pad is concentric-square-shaped; the heat dissipation plate is flat-plate-shaped; a height of the heat dissipation pad is matched with a height of the first chip; the cooling liquid cavity is defined in the heat dissipation plate;

wherein the heat dissipation pad is fixed on the first surface of the substrate and surrounds the first chip; an inner side wall of the heat dissipation pad forms the side wall of the first groove; the heat dissipation plate is fixed above the heat dissipation pad and the first chip; a surface of the heat dissipation plate forms the bottom wall of the first groove; and each of the first conductive columns passes through the heat dissipation pad and the heat dissipation plate.

2. The chip stacking and packaging structure according to claim 1, wherein the heat dissipation module comprises first sleeves; each of the first sleeves is spaced apart from the first groove; each of the first conductive columns is sleeved in a corresponding first sleeve of the first sleeves.

3. The chip stacking and packaging structure according to claim 2, wherein sheet-shaped heat conducting plates respectively connected to the bottom wall of the first groove are arranged in the cooling liquid cavity; the sheet-shaped heat conducting plates are respectively perpendicular to the bottom wall of the first groove and distributed along a flow direction of cooling liquid in the cooling liquid cavity.

4. The chip stacking and packaging structure according to claim 2, wherein heat conducting columns respectively connected to the bottom wall of the first groove are arranged in the cooling liquid cavity; the heat conducting columns are respectively perpendicular to the bottom wall of the first groove.

5. The chip stacking and packaging structure according to claim 2, wherein the heat dissipation module comprises a main body portion and a cover plate; the main body portion comprises a bottom plate and four side plates; and the first groove is located on the bottom plate; a first end of each of the four side plates is perpendicularly connected to a corresponding edge of four edges of the bottom plate; a second end of each of the four side plates is fixed to the cover plate; the bottom plate, the four side plates, and the cover plate enclose to define the cooling liquid cavity; a first end of each of the first sleeves is perpendicularly connected to the bottom plate; a second end of each of the first sleeves extends to the cover plate.

6. The chip stacking and packaging structure according to claim 1, wherein flow guide partition plates are arranged in the cooling liquid cavity; the flow guide partition plates are respectively perpendicular to the first surface or the second surface of the heat dissipation module; the flow guide partition plates are distributed along a flow direction of cooling liquid in the cooling liquid cavity; the first conductive columns are respectively arranged in the flow guide partition plates.

7. The chip stacking and packaging structure according to claim 1, wherein third bonding pads are arranged on the first surface of the substrate;

wherein the heat dissipation module comprises second conductive columns and a second groove; an opening of the second groove is on the first surface of the heat dissipation module; an area of a cross section of the second groove is greater than an area of a cross section of the first groove; and at least a portion of the second groove is arranged outside an orthographic projection of the first groove; each of the second conductive columns passes through the cooling liquid cavity from a bottom wall of the second groove and is connected to the second surface of the heat dissipation module; the second conductive columns are spaced apart from the first groove; a bottom end of each of the second conductive columns is electrically connected with a corresponding third bonding pad of the third bonding pads arranged on the substrate;

wherein the chip stacking and packaging structure further comprises a temperature sensing chip; the third welding pins are arranged on a surface of the temperature sensing chip; the temperature sensing chip is embedded in the second groove and is electrically connected to a top end of each of the second conductive columns through a corresponding third welding pins of the third welding pins.

8. The chip stacking and packaging structure according to claim 1, wherein a second surface of the first chip defines an electromagnetic shielding layer.

9. The chip stacking and packaging structure according to claim 1, wherein the chip stacking and packaging structure further comprises a packaging body; the substrate, the first chip, the second chip, and the heat dissipation module are integrally packaged to form a chip main body through the packaging body; the liquid inlet and the liquid outlet respectively extend out of the packaging body; connecting heads are respectively arranged on a portion, extending out of the packaging body, of the liquid inlet and a portion, extending out of the packaging body, of the liquid outlet.

* * * * *